United States Patent
Kang et al.

(10) Patent No.: US 12,495,515 B2
(45) Date of Patent: Dec. 9, 2025

(54) LIQUID COOLED HEAT EXCHANGER

(71) Applicant: Aavid Thermalloy, LLC, Laconia, NH (US)

(72) Inventors: Sukhvinder S. Kang, Concord, NH (US); Chad Turmelle, Pembroke, NH (US)

(73) Assignee: Aavid Thermalloy, LLC, Laconia, NH (US)

( * ) Notice: Subject to any disclaimer, the term of this patent is extended or adjusted under 35 U.S.C. 154(b) by 615 days.

(21) Appl. No.: 17/686,780

(22) Filed: Mar. 4, 2022

(65) Prior Publication Data

US 2023/0284414 A1 Sep. 7, 2023

(51) Int. Cl.
*H05K 7/20* (2006.01)

(52) U.S. Cl.
CPC ................. *H05K 7/20254* (2013.01)

(58) Field of Classification Search
CPC .................................... H05K 7/20254
USPC ....................................... 165/80.4
See application file for complete search history.

(56) References Cited

U.S. PATENT DOCUMENTS

| | | | | |
|---|---|---|---|---|
| 5,016,090 A | * | 5/1991 | Galyon | H01L 23/4336 257/714 |
| 5,835,345 A | * | 11/1998 | Staskus | H05K 7/20254 174/15.1 |
| 5,959,351 A | * | 9/1999 | Sasaki | H01L 23/473 257/E23.098 |
| 6,578,626 B1 | * | 6/2003 | Calaman | F28F 3/12 257/E23.098 |
| 6,719,039 B2 | * | 4/2004 | Calaman | F28F 3/022 257/E23.098 |
| 7,007,506 B2 | * | 3/2006 | Kubo | H05K 7/20309 165/170 |
| 7,017,654 B2 | * | 3/2006 | Kenny | H01L 21/4871 174/15.1 |
| 7,044,199 B2 | * | 5/2006 | Thayer | H01L 23/473 257/E23.098 |
| 7,190,580 B2 | * | 3/2007 | Bezama | F28F 13/06 174/15.1 |
| 7,339,788 B2 | * | 3/2008 | Olesen | F28F 9/0268 257/E23.098 |

(Continued)

FOREIGN PATENT DOCUMENTS

JP S64-071156 A 3/1989

OTHER PUBLICATIONS

International Search Report and Written Opinion for International Application No. PCT/US2023/014081, mailed May 30, 2023.

*Primary Examiner* — Claire E Rojohn, III
(74) *Attorney, Agent, or Firm* — Wolf, Greenfield & Sacks, P.C.

(57) ABSTRACT

A liquid cooled heat exchanger includes first and second heat exchange chambers that are in thermal communication. The first heat exchange chamber is downstream of the second heat exchanges chamber and receives heat from a heat generating device, such as an electronic circuit. Heat in the first heat exchange chamber can be transferred to the second heat exchange chamber to increase the temperature of a subcooled liquid working fluid in the second heat exchange chamber. This can render a pressure drop across the heat exchanger that is relatively insensitive to a fraction of liquid that is vaporized in the first heat exchange chamber.

22 Claims, 6 Drawing Sheets

(56) References Cited

U.S. PATENT DOCUMENTS

| | | | |
|---|---|---|---|
| 7,360,582 B2* | 4/2008 | Olesen | H01L 23/473 257/E23.098 |
| 7,762,314 B2* | 7/2010 | Campbell | H01L 23/427 165/80.4 |
| 7,836,597 B2* | 11/2010 | Datta | H01L 21/4882 29/890.032 |
| 8,014,150 B2* | 9/2011 | Campbell | H05K 7/20809 165/185 |
| 8,066,057 B2* | 11/2011 | Olesen | F28F 9/0268 165/80.4 |
| 8,245,764 B2* | 8/2012 | Eriksen | H01L 23/473 165/80.4 |
| 8,474,516 B2* | 7/2013 | Valenzuela | F28F 3/12 165/80.4 |
| 8,490,681 B2* | 7/2013 | Eisele | F28F 9/0268 165/169 |
| 8,616,267 B2* | 12/2013 | Capriz | H01L 23/473 165/80.4 |
| 8,746,330 B2* | 6/2014 | Lyon | F28F 3/00 165/170 |
| 8,937,810 B2* | 1/2015 | Brunschwiler | H05K 7/20772 165/185 |
| 8,944,151 B2* | 2/2015 | Flotta | H05K 7/20772 165/80.4 |
| 9,057,567 B2* | 6/2015 | Lyon | H01L 23/473 |
| 9,282,650 B2* | 3/2016 | Dhavaleswarapu | B23K 20/026 |
| 9,795,058 B2* | 10/2017 | Tsai | H05K 7/20272 |
| 10,160,072 B2* | 12/2018 | Boday | H05K 7/20254 |
| 10,299,406 B2* | 5/2019 | Lin | H05K 7/20409 |
| 10,410,955 B2* | 9/2019 | Tsai | H01L 23/473 |
| 10,431,524 B1* | 10/2019 | Lan | F28D 1/035 |
| 10,509,446 B2* | 12/2019 | Tsai | G06F 1/20 |
| 10,533,809 B1* | 1/2020 | Sherrer | H01L 23/4735 |
| 10,739,084 B2* | 8/2020 | Tsai | H05K 7/20254 |
| 10,757,833 B2* | 8/2020 | Bodenweber | H05K 7/20254 |
| 10,827,647 B2* | 11/2020 | Lin | F28F 3/12 |
| 10,890,360 B2* | 1/2021 | Ooka | F25B 9/14 |
| 11,032,940 B2* | 6/2021 | Matsumura | H05K 7/20772 |
| 11,129,310 B2* | 9/2021 | Arai | B60R 16/02 |
| 11,287,861 B2* | 3/2022 | Eriksen | G06F 1/206 |
| 11,473,860 B2* | 10/2022 | Holden | F28F 27/00 |
| 11,622,472 B2* | 4/2023 | Tsai | H01L 23/473 165/80.4 |
| 11,644,254 B2* | 5/2023 | Klaba | F28F 13/06 165/104.31 |
| 11,664,295 B2* | 5/2023 | Chehade | F28F 3/12 361/699 |
| 11,725,886 B2* | 8/2023 | Mostafavi Yazdi | H05K 7/20272 165/80.4 |
| 11,812,582 B2* | 11/2023 | Gao | H05K 7/20772 |
| 11,856,728 B2* | 12/2023 | Chen | H05K 7/20263 |
| 11,910,564 B2* | 2/2024 | Lin | H01L 23/473 |
| 11,948,860 B2* | 4/2024 | Suzuki | F28F 13/06 |
| 12,099,385 B2* | 9/2024 | Tsai | G06F 1/20 |
| 2004/0112571 A1* | 6/2004 | Kenny | F28D 15/00 165/905 |
| 2004/0163797 A1* | 8/2004 | Cosley | F28F 3/02 257/E23.098 |
| 2007/0119565 A1* | 5/2007 | Brunschwiler | H01L 23/4735 165/80.2 |
| 2012/0152498 A1* | 6/2012 | Lyon | H01L 23/473 165/104.19 |
| 2012/0175094 A1* | 7/2012 | Rice | F28F 3/12 165/170 |
| 2014/0268571 A1* | 9/2014 | Kang | G06F 1/20 361/699 |
| 2014/0290042 A1* | 10/2014 | Loong | H05K 13/00 29/592.1 |
| 2015/0351283 A1* | 12/2015 | Yamada | H01L 23/473 165/80.4 |
| 2016/0111350 A1* | 4/2016 | Chen | H01L 23/44 165/80.4 |
| 2017/0043437 A1* | 2/2017 | Boday | H05K 7/20772 |
| 2017/0045307 A1* | 2/2017 | Tsai | H01L 23/473 |
| 2017/0235350 A1* | 8/2017 | Tsai | G06F 1/20 165/80.4 |
| 2018/0090417 A1* | 3/2018 | Gutala | H01L 21/4882 |
| 2018/0204784 A1* | 7/2018 | Kawase | H01L 25/072 |
| 2018/0213677 A1* | 7/2018 | Wu | H01L 23/473 |
| 2020/0100396 A1* | 3/2020 | Iyengar | H05K 7/20254 |
| 2020/0340767 A1* | 10/2020 | Holden | H05K 7/20254 |
| 2020/0359528 A1* | 11/2020 | Tsai | H05K 7/20509 |
| 2022/0071056 A1* | 3/2022 | Lin | H01L 23/473 |
| 2022/0232732 A1* | 7/2022 | Alvarado | H05K 7/20254 |
| 2022/0373275 A1* | 11/2022 | Mostafavi Yazdi | H05K 7/20272 |
| 2022/0377937 A1* | 11/2022 | Chen | H05K 7/20254 |
| 2023/0240043 A1* | 7/2023 | Zhang | H01L 23/473 |
| 2023/0262947 A1* | 8/2023 | Vakilimoghaddam | H05K 7/20254 165/80.4 |
| 2023/0284414 A1* | 9/2023 | Kang | F28F 3/12 165/80.4 |

\* cited by examiner

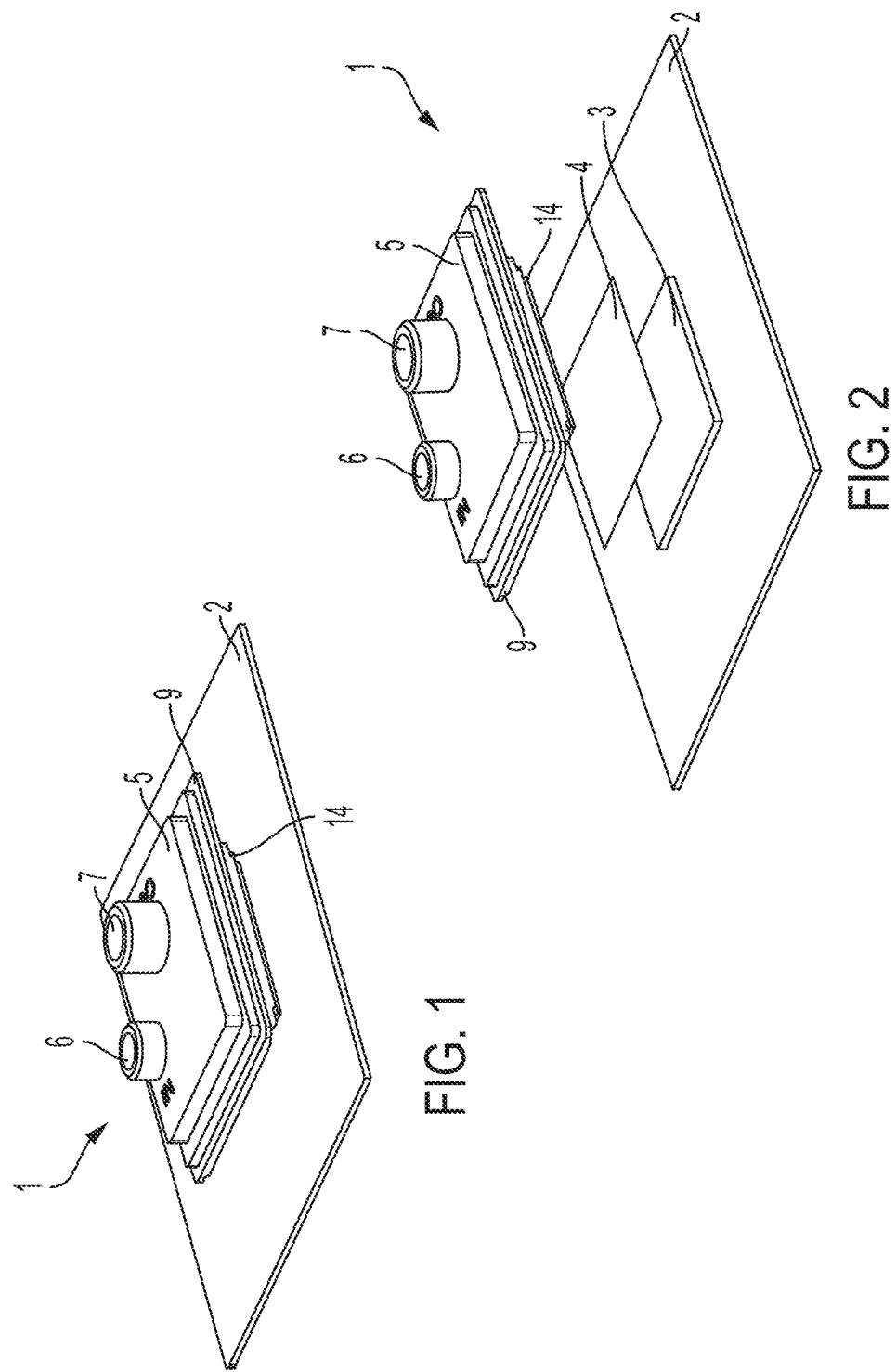

LIQUID COOLED HEAT EXCHANGER

FIELD OF INVENTION

A liquid cooled heat exchanger, e.g., for cooling electronics using a circulated flow of cooling fluid.

BACKGROUND

With the development of electronic technology, heat dissipation requirements for computer processing devices, e.g., integrated circuits or chips, has increased, requiring ever higher efficiency liquid cooled heat exchange devices, e.g., liquid cooled heat sinks or liquid cold plates, to remove the heat generated by these devices.

SUMMARY OF INVENTION

One type of device used to cool electronics or other heat generating devices is a liquid cold plate or liquid cooled heat exchanger that thermally couples a heat generating device (such as a computer processor) to a heat sink that includes a plurality of fins. At least a portion of the heat sink may be enclosed in a cavity in which a cooling fluid is circulated so that heat may be transferred from the heat sink to the fluid and removed from the cavity. In some embodiments, a first heat sink may be sandwiched between upper and lower plates so that the heat sink is located in a cavity defined by the plates. As an example, the first heat sink may be placed on the upper surface of a lower plate or base, and an upper plate having a cavity formed in an underside may be placed over the base so the first heat sink is enclosed in the cavity. The base and upper plate may be secured together to form a liquid-tight seal around the cavity so that cooling fluid can be circulated into the cavity without leaking. The first heat sink can include boiling enhancement features, such as surface roughness, sintered metal powder coating, blind holes and/or reentrant cavities, to promote and enhance boiling of the working fluid. A second heat sink can be provided on the upper surface of the upper plate so that heat can be transferred from the cavity to the second heat sink. Cooling fluid can be warmed by the second heat sink before flowing to contact the first heat sink, where the cooling fluid can be at least partially vaporized. This pre-heating of the cooling fluid can help prevent relatively large temperature gradients at the first heat sink. Cooling fluid can be provided to the second heat sink via a capillary tube, which can function to suitably reduce a pressure of the cooling liquid, provide an appropriate flow rate of cooling fluid to the system and/or help make the pressure drop across the heat exchanger less sensitive to the vapor quality of working fluid exiting the heat exchanger.

In some embodiments, a liquid cooled heat exchanger includes a base having a surface configured to receive heat from a heat generating component, a first heat sink having a plurality of fins arranged on the base to receive the heat from the base, and a first heat exchange chamber having an inlet and an outlet and enclosing the first heat sink. The first heat exchange chamber can be configured to deliver liquid working fluid from the inlet to contact the first heat sink and deliver vapor working fluid from outlet, e.g., the working fluid can be boiled by heat received from the first heat sink in the first heat exchange chamber. A second heat exchange chamber can have an inlet to receive liquid working fluid and an outlet to deliver the liquid working fluid to the inlet of the first heat exchange chamber. In some cases, the second heat exchange chamber can be thermally coupled to the first heat exchange chamber to receive heat from the first heat exchange chamber and transfer the heat to the liquid working fluid in the second heat exchange chamber. For example, this configuration can permit the second heat exchange chamber to warm subcooled working fluid provided to the heat exchanger such that the working fluid is closer to its saturation temperature when provided to the inlet of the first heat exchanger chamber.

In some cases, a capillary flow channel or other flow restrictor can be fluidly coupled to the inlet of the second heat exchange chamber to provide the liquid working fluid to the second heat exchange chamber. This flow restrictor can function as a majority of the pressure drop across the heat exchanger, e.g., 50% or more of the total pressure drop. This configuration can help make the pressure drop across the heat exchanger less sensitive to the exit vapor quality of working fluid output from the heat exchanger.

In some cases, a plate having first and second sides can be provided with the first side of the plate defining in part the first heat exchange chamber and the second side of the plate defining in part the second heat exchange chamber. The plate can be attached to the base such that the plate and base enclose the first heat sink in the first heat exchange chamber, e.g., the first heat sink can be located in a space between the base and the plate. In some embodiments, the plate includes an inlet opening to define the inlet to the first heat exchange chamber and an outlet opening to define the outlet from the first heat exchange chamber. The inlet opening can be smaller in size than the outlet opening, e.g., the inlet opening can be arranged as a narrow slot that functions as a flow restrictor for the working fluid entering the first heat exchange chamber.

In some embodiments, a cover is provided that together with the plate defines the second heat exchange chamber. For example, the cover can define the inlet to the second heat exchange chamber and the cover can include a flow passage to carry liquid working fluid to the second heat exchange chamber. In some cases, the flow passage can include a capillary tube or other flow restrictor as discussed above. In some embodiments, the plate includes heat transfer structure such as one or more fins on the second side of the plate that is thermally coupled to the first heat exchange chamber. In some cases, working fluid can flow in a second direction in the second heat exchange chamber that is parallel to and opposite to flow of working fluid in the first heat exchange chamber. In some embodiments, the second heat exchange chamber can include a portion that increases in cross sectional area in a direction from the inlet to the outlet of the second heat exchange chamber, e.g., the second heat exchange chamber can have a Y shape such that the chamber enlarges in width from the inlet to the outlet. In some cases, the second heat exchange chamber partially overlaps the first heat exchange chamber, e.g., the second heat exchange chamber can overlap an inlet portion of the first heat exchange chamber.

In some embodiments, the second heat exchange chamber is configured to receive subcooled liquid working fluid at the inlet of the second heat exchange chamber, heat the subcooled liquid working fluid in the second heat exchange chamber to increase the temperature of the subcooled liquid working fluid, and deliver the heated liquid working fluid to the inlet of the first heat exchange chamber. In some cases, the first heat sink includes boiling enhancement features to promote and enhance boiling of the working fluid, and the first heat exchange chamber can be configured to heat the liquid working fluid received at the inlet of the first heat exchange chamber to vaporize the liquid working fluid using heat received from the heat generating device and deliver vapor working fluid to the outlet of the first heat exchange chamber.

In some embodiments, a liquid cooled heat exchanger includes a base having a first surface and a second surface configured to receive heat from a heat generating component. A first heat sink having a plurality of fins can be arranged on the first surface of the base to receive the heat from the base, and a plate having first and second sides can be arranged so the first side of the plate is positioned over the base such that the first heat sink is located in a first heat exchange chamber between the plate and the base. The first heat sink can include boiling enhancement features to promote and enhance boiling of the working fluid. A cover having first and second sides can be provided so the second side of the cover is positioned over the second side of the plate to define a second heat exchange chamber between the cover and the plate. The cover can include an inlet for liquid working fluid provided to the second heat exchange chamber, and an outlet to receive vapor working fluid from the first heat exchange chamber. The base, plate and cover can be configured to define a flow path for working fluid that extends from the inlet to the second heat exchange chamber, to the first heat exchange chamber and to the outlet. As an example, liquid working fluid can be provided to the inlet, warmed in the second heat exchange chamber and provided in liquid form to the inlet of the first heat exchange chamber, where the working fluid is boiled or otherwise vaporized and output in at least partial vapor form from the outlet.

In some embodiments, the plate can be configured to transfer heat from the first heat exchange chamber to liquid working fluid in the second heat exchange chamber, e.g., to warm subcooled liquid working fluid in the second heat exchange chamber so as to be closer to its saturation temperature. In some cases, the plate includes fins on the second side located in the second heat exchange chamber that transfer heat from the first heat exchange chamber to liquid working fluid in the second heat exchange chamber. In some embodiments, the second heat exchange chamber partially overlaps the first heat exchange chamber, e.g., the second heat exchange chamber can overlap an inlet portion of the first heat exchange chamber. In some cases, a portion of the second heat exchange chamber increases in cross sectional area in a flow direction from the inlet toward the outlet.

In some embodiments, the cover includes a flow passage to carry liquid working fluid from the inlet to the second heat exchange chamber, and the flow passage can include a capillary tube to reduce a pressure of the liquid working fluid.

In some cases, the plate includes an inlet opening to transfer working fluid from the second heat exchange chamber to the first heat exchange chamber and an outlet opening to transfer working fluid from the second heat exchange chamber to the outlet. The inlet opening of the plate can be configured as a narrow slot to function as a flow restrictor.

These and other aspects of the invention will be appreciated from the following description and claims.

BRIEF DESCRIPTION OF THE DRAWINGS

Aspects of the invention are described with reference to the following drawings in which numerals reference like elements, and wherein:

FIG. 1 is a perspective view of a heat exchanger and associated heat generating device in an illustrative embodiment;

FIG. 2 is an exploded perspective view of the FIG. 1 embodiment;

DETAILED DESCRIPTION

Figure 3:
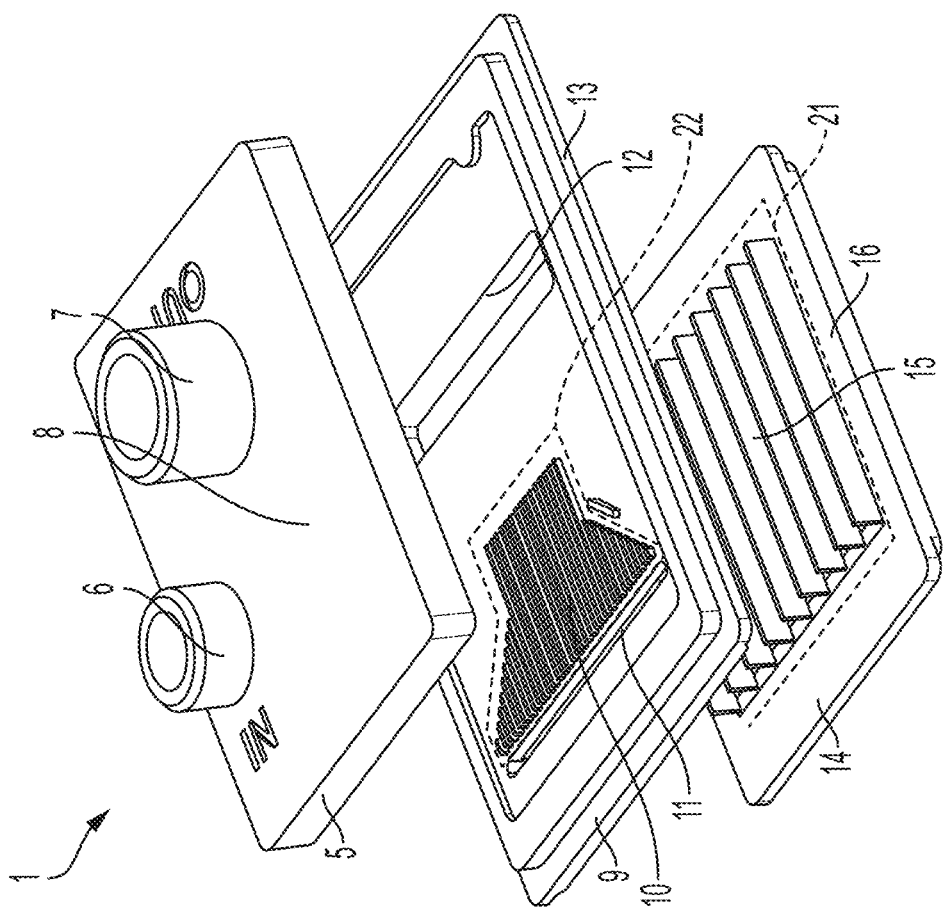
FIG. 3 is an exploded perspective view of the heat exchanger of the FIG. 1 embodiment.

Aspects of the invention are not limited in application to the details of construction and the arrangement of components set forth in the following description or illustrated in the drawings. Other embodiments may be employed and aspects of the invention may be practiced or be carried out in various ways. Also, aspects and/or different features of embodiments of the invention may be used alone or in any suitable combination with each other. Thus, the phraseology and terminology used herein is for the purpose of description and should not be regarded as limiting.

FIGS. 1 and 2 show a heat exchanger 1 in an illustrative embodiment. The heat exchanger 1 includes a base 14, which may be made of a thermally conductive material such as aluminum, copper or other suitable material. The base 14 can be thermally coupled to a heat generating device 3, such as a computer processing device or other electronic component carried on a circuit board 2, to receive heat from the heat generating device 3. The base 14 can be thermally coupled to the heat generating device 3 in any suitable way, such as by directly contacting the heat generating device 3 to a bottom surface of the base 14 or via an optional thermal interface component 4. The heat exchanger 1 can include a plate 9 positioned over the base 14 and a cover positioned over the plate 9. Working fluid can be introduced to the heat exchanger 1, e.g., in subcooled liquid form, via an inlet 6 and removed from the heat exchanger 1 via an outlet 7, e.g., in vapor or mixed vapor and liquid form. Thus, heat from the heat generating device 3 can be received by the heat exchanger 1 and transferred to working fluid, which can carry the heat to a remote location for transfer to another device and/or to a surrounding environment. Cooled working fluid can be returned to the heat exchanger 1 for repeated cooling cycles.

FIG. 3 shows an exploded view of the heat exchanger 1. In some embodiments, the heat exchanger can have first and second heat exchanger chambers 21, 22 that each receive working fluid and transfer heat to the working fluid. The heat exchanger 1 is configured so that working fluid received at the inlet 6 flows to the second heat exchange chamber 22, and then to the first heat exchange chamber 21 and to the outlet 7. The first heat exchanger chamber 21 can be arranged to receive heat from the heat generating device 3 and transfer the heat to working fluid in the first heat exchanger chamber 21. In some examples, the base 14 can have a first side on which one or more heat sinks 15 or other arrangement having thermal transfer structure such as fins, pins, etc. are arranged to contact and transfer heat to working fluid, e.g., via conduction and/or radiation. For example, a second side of the base 14 opposite the first side can be configured to directly contact the heat generating device 3 or otherwise receive heat from the heat generating device, e.g., by conduction, and transfer the heat via conduction to a heat sink 15 that contacts the working fluid. The heat sink or other thermal transfer structure may be arranged in any suitable way, e.g., formed of aluminum, copper or other conductive material and having upstanding plate-like fins extending upwardly from the first side of the base 14. Fins of the heat sink 15 can be relatively widely spaced to provide low flow resistance channels for working fluid through the first heat exchanger chamber 21. The surface of the widely spaced fins 15 can include boiling enhancement features to promote and enhance boiling of the working fluid, for example through surface roughness, sintered metal powder coating, blind holes, reentrant cavities, etc. The heat sink 15 can be formed unitarily with the base 14, or can be made in one or more separate parts and attached to the base 14. The plate 9 can be attached to the base 14 such that the plate 9 and base 14 enclose the heat sink 15 in the first heat exchange chamber 21. For example, a first side of the plate 9 can define, at least in part, the first heat exchange chamber 21 and be attached to the base 14 so the heat sink 15 is positioned between the plate 9 and the base 14. In some examples, the plate 9 can be attached to the base 14 at a flange 13 that extends around the outer periphery of the plate 9, e.g., by clamping, welding, fasteners, brazing, adhesives, etc. In some cases, the plate 9 can have a cavity or recess in the first side (e.g., the bottom side as in FIG. 3) that at least partially receives the heat sink 15 and defines the first heat exchange chamber 21 with the base 14. In some cases, the tips of the fins of heat sink may be joined to the bottom side of plate 9, e.g., by welding, brazing, adhesives, etc. The first side of the base 14 may have a cavity or recess in which the heat sink 15 is at least partially received.

In some cases, the plate 9 can define the second heat exchange chamber 22 with a portion of the cover 5. For example, the cover 5 can be attached over the plate 9 so as to enclose the second heat exchanger chamber 22, e.g., by clamping, welding, adhesive, etc. In some embodiments, the plate 9 can include a heat sink 10 such as fins, pins or other heat transfer structure in the second heat exchanger chamber 22. Flow channels defined by the fins of the heat sink 10 can be significantly smaller in size (e.g., cross sectional area) as compared to flow channels defined by fins of the first heat sink 15. The heat sink 10 can be made unitarily with the plate 9 or made in one or more separate parts and attached to the plate 9. The heat sink 10 can transfer heat from the plate 9 to the working fluid in the second heat exchanger chamber 22.

In some cases, the second heat exchange chamber 22 can be configured to receive heat from the first heat exchange chamber 21, and thus only indirectly receive heat from the heat generating device 3. For example, the first side of the plate 9 can receive heat from the first heat exchanger chamber 21, e.g., by conduction, convection and/or radiation, and transfer the heat, e.g., by conduction, to the second heat exchange chamber 22 via the heat sink 10 or other portions of the second side of the plate 9. In some cases, the second heat exchange chamber 22 can be arranged on a second side of the plate 9 that is opposite to the first side as shown in FIG. 3. As described more herein, this arrangement can provide benefits such as increasing a temperature of subcooled liquid working fluid in the second heat exchange chamber 22 without risk of vaporizing the working fluid. This can result because the second heat exchange chamber 22 can receive heat from a portion of the first heat exchange chamber 21 that is operating at the saturation temperature of the working fluid. In some cases, the second heat exchange chamber 22 partially overlaps the first heat exchange chamber 21, e.g., the second heat exchange chamber 22 can overlap only an inlet portion of the first heat exchange chamber 21 as shown in FIG. 3. Since the inlet portion of the first heat exchange chamber 21 may only operate at temperatures at or below the saturation temperature, the second heat exchange chamber 22 can avoid being exposed to temperatures or other heat transfer that is capable of vaporizing the working fluid in the second heat exchange chamber 22.

Figure 4:
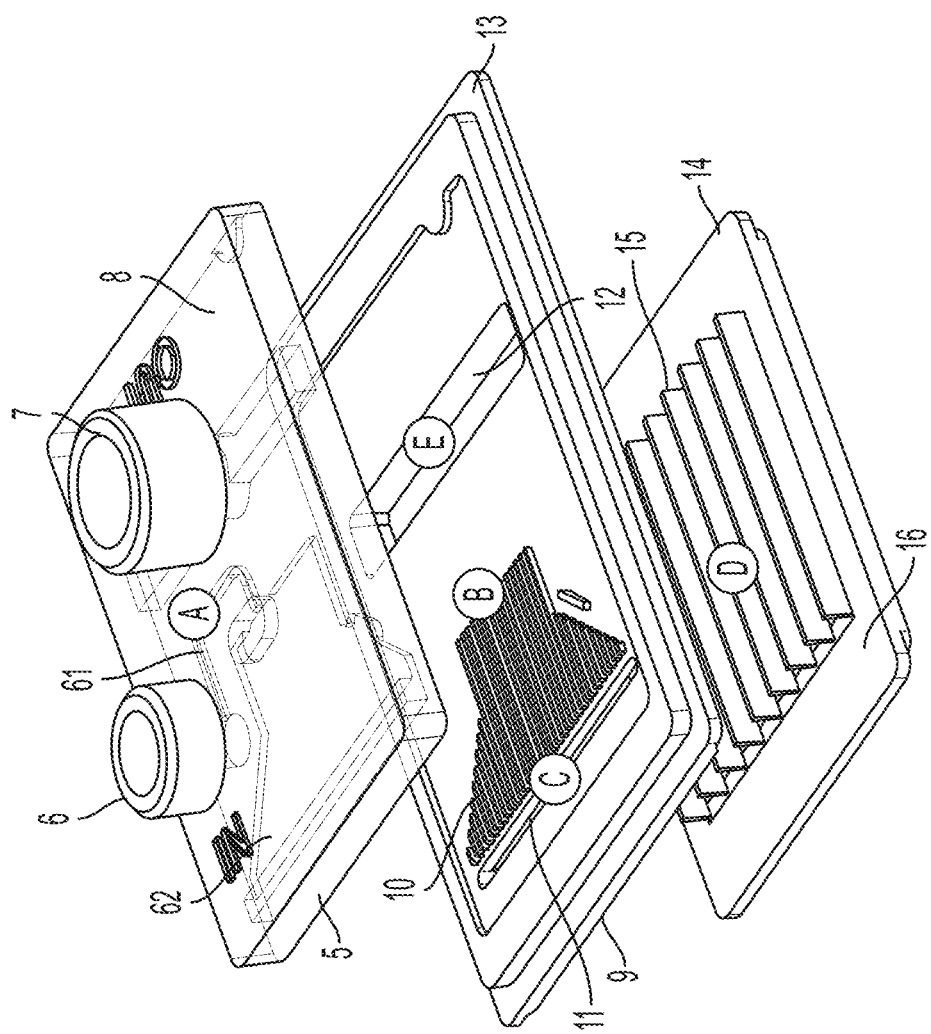
FIGS. 4 and 5 are exploded perspective views of the heat exchanger of the FIG. 1 embodiment illustrating working fluid flow sections of the heat exchanger.
Figure 5:
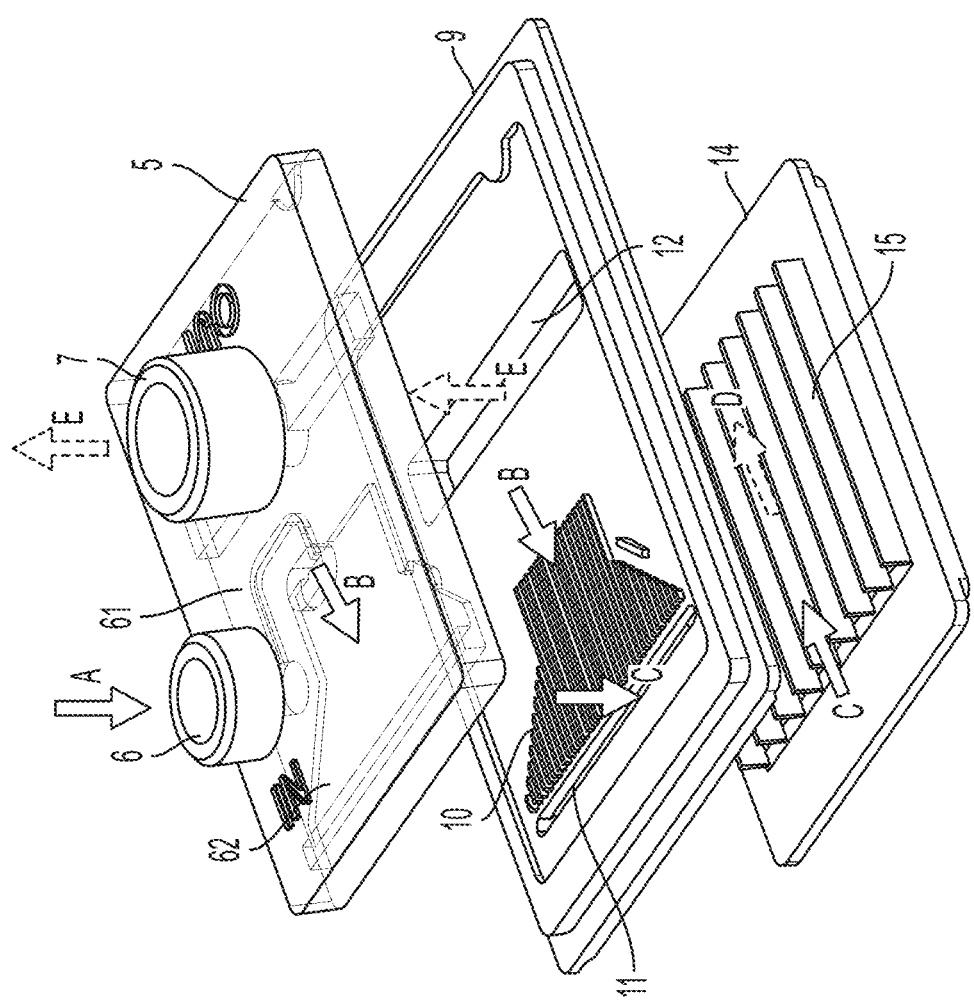

FIGS. 4 and 5 show working fluid flow sections of the heat exchanger 1 and how working fluid can move through the system. Working fluid can be introduced into the heat exchanger 1 via the inlet 6 which can be defined by the cover 5. Working fluid received at the inlet 6 can be conducted by a flow channel 61 of the cover 5 (flow section A) to an inlet of the second heat exchanger chamber 22. In some cases, the flow channel 61 (or other portion of flow section A) can be configured to reduce a pressure of the liquid working fluid received at the inlet 6 or otherwise function to meter flow of liquid working fluid to the second heat exchange chamber 22. For example, the flow channel 61 can have a capillary tube or orifice or other flow restrictor arrangement to reduce the pressure of the liquid working fluid. The pressure drop in the flow channel 61 can constitute the majority of the pressure drop through the heat exchanger, e.g., 50% or more, 70% or more, 80% or more, 90% or more, or 95% or more. Working fluid can flow into an inlet of the second heat exchanger chamber 22 (flow section B) to receive heat in the second heat exchange chamber 22. For example, subcooled liquid working fluid introduced into the second heat exchanger chamber 22 can be increased in temperature while remaining in a liquid state. Warming of subcooled liquid working fluid can help avoid high temperature gradients in the first heat exchange chamber 21, particularly in areas near the inlet, because the working fluid will be nearer the saturation temperature when it enters the first heat exchange chamber 21. As can be seen in FIG. 4, the cover 5 can in some cases have a recess or cavity that partially defines the second heat exchanger chamber 22. For example, a recess or cavity in a second side of the cover 5 opposite the first side 8 of the cover 5 can define a space into which at least a portion of the heat sink 10 is received. Alternately, or in addition, the plate 9 can have a cavity or recess in which to receive the heat sink 10 or otherwise define the second heat exchange chamber 22. In some cases, the second heat exchange chamber 22 can have a portion that increases in size, e.g., with respect to a cross sectional area transverse to the flow direction, in a direction from the inlet to the outlet of the second heat exchanger chamber 22. For example, FIG. 4 shows an arrangement in which the second heat exchange chamber 22 has a relatively constant size in an inlet portion (flow section B) of the second heat exchange chamber 22, but an outlet portion of the second heat exchanger chamber 22 flares outwardly to define a Y shape for the second heat exchange chamber 22. The increase in cross sectional area in the direction from the inlet to the outlet of the second heat exchange chamber 22 can help reduce the pressure drop across the second heat exchange chamber 22 and/or increase an area of the second heat exchange chamber 22 that can receive heat from the first heat exchange chamber 21.

The warmed liquid working fluid in the second heat exchange chamber 22 exits the second heat exchanger chamber 22 and flows through an inlet opening 11 (flow section C) to the inlet of the first heat exchange chamber 21. The inlet opening 11 can be relatively wide, e.g., having a same width as the outlet end of the second heat exchanger chamber 22, and be relatively narrow in the perpendicular direction to form a narrow slot that acts as a flow restriction.

The liquid working fluid flowing into the first heat exchanger chamber 21 can flow across the heat sink 15 (flow section D) and receive heat so as to be at least partially vaporized. Vapor working fluid exits the first heat exchanger chamber 21 via an outlet opening 12 (flow section E) defined by the plate 9 and flows to the outlet 7 defined by the cover 5. In some cases, the inlet opening 11 can have a size (e.g., minimum cross-sectional area for fluid flow) that is a factor or 4 or more smaller than the outlet opening 12. This can help spread the working fluid evenly across the width of the heat transfer fins 15, e.g., by increasing the pressure drop through opening 11 and reduce a pressure drop downstream of the first heat exchanger chamber 21, e.g., by providing a relatively large area opening 12 for vapor working fluid to exit the first heat exchange chamber 21.

In some cases, the second heat exchanger chamber 22 can have at least a portion that overlaps or is positioned adjacent to at least a portion of the first heat exchanger chamber 21. This arrangement can aid in transferring heat from the first heat exchanger chamber 21 to the second heat exchanger chamber 22. This can be achieved in some examples by having the first and second heat exchanger chambers 21, 22 located on opposite sides of the plate 9. In some cases, the second heat exchanger chamber 22 overlaps an inlet portion of the first heat exchanger chamber 21, e.g., and does not overlap an outlet portion of the first heat exchanger chamber 21. This can help prevent transfer of heat from relatively warmer (vapor may become superheated in some cases) portions of the first heat exchanger chamber 21 to the second heat exchanger chamber 22. In some embodiments, the second heat exchange chamber 22 has a larger area exposed to portions of the first heat exchange chamber 21 that are closer to the inlet of the first heat exchange chamber 21 and a smaller area exposed to portions of the first heat exchange chamber 21 that are farther from the inlet (and closer to the outlet) of the first heat exchange chamber 21. This can help control a rate and/or total amount of heat received by the second heat exchange chamber 22 from the first heat exchange chamber 21, e.g., because working fluid in the first heat exchange chamber 21 will increase in temperature and/or total heat with distance from the inlet of the first heat exchange chamber 21. The flow of working fluid in the second heat exchange chamber 22 that is parallel to and opposite in direction relative to flow of working fluid in the first heat exchange chamber 21 can help control heat transfer from the first heat exchange chamber 21 to the second heat exchange chamber 22.

The inventors have appreciated that liquid cooled heat exchangers in which coolant undergoes a change of phase from liquid to vapor are attractive for cooling high power electronics modules such as CPU's, GPU's, and various types of ASIC's used in high performance computers, telecommunication switches, routers etc. In such applications, multiple liquid heat exchangers are typically connected within a liquid cooling loop with individual liquid heat exchangers in contact with different electronics modules to carry away heat that is generated within those modules. Liquid heat exchangers may be connected in the cooling loop in various ways, including combinations of series and/or parallel paths for receiving working fluid. Also, multiple cooling loops are typically connected to the same overall liquid cooling network in parallel. External means such as Coolant Distribution Units (CDU's) that contain pumps and heat exchangers are typically provided to supply cooled working fluid to and remove heated or vaporized fluid from the cooling network.

A phase changing coolant can absorb large amounts of heat through its latent heat of vaporization while maintaining an essentially constant temperature which allows multiple electronics modules cooled within the liquid cooling loop/liquid cooling network to operate at essentially the same temperature and thereby maintain the highest potential performance. By comparison, alternative single phase liquid coolants undergo a significant temperature rise to absorb the same heat, leading to temperature variations among the electronics components within the liquid cooling loop/liquid cooling network leading to the overall system performance being limited by the hottest component.

However, phase changing coolants present certain challenges, for example, the coolant undergoes a large amount of acceleration when it changes from a purely liquid phase to a two-phase liquid-vapor mixture so the pressure drop across liquid heat exchangers that cool higher power modules, where more vaporization occurs, is much greater than liquid heat exchangers that cool lower power modules. The higher the fraction of coolant vaporized in the liquid heat exchangers, the higher is the pressure drop. The undesirable result is that within a parallel flow network, more coolant tends to wastefully flow to the liquid heat exchangers on the lower power modules because of their lower pressure drop, robbing coolant flow from the higher power modules where the most cooling is needed. Computing and communications systems are highly dynamic and power dissipation within the modules frequently undergoes large swings that can cause large undesirable fluid flow maldistribution in the coolant flow network, including dryout in liquid heat exchangers and overheating of modules where power dissipation is highest.

Another drawback is that the coolant is typically supplied to the liquid heat exchangers in a subcooled state in order to avoid undesirable cavitation within pumps and flow restricting components like quick disconnects, valves, and the aforementioned flow restricting nozzles. The convective heat transfer rate from the finned surface inside the liquid heat exchangers to the subcooled coolant is much lower than boiling heat transfer to coolant in the saturated state, leading to undesirable high temperature gradients near the coolant inlet region of the liquid heat exchangers.

Figure 6:
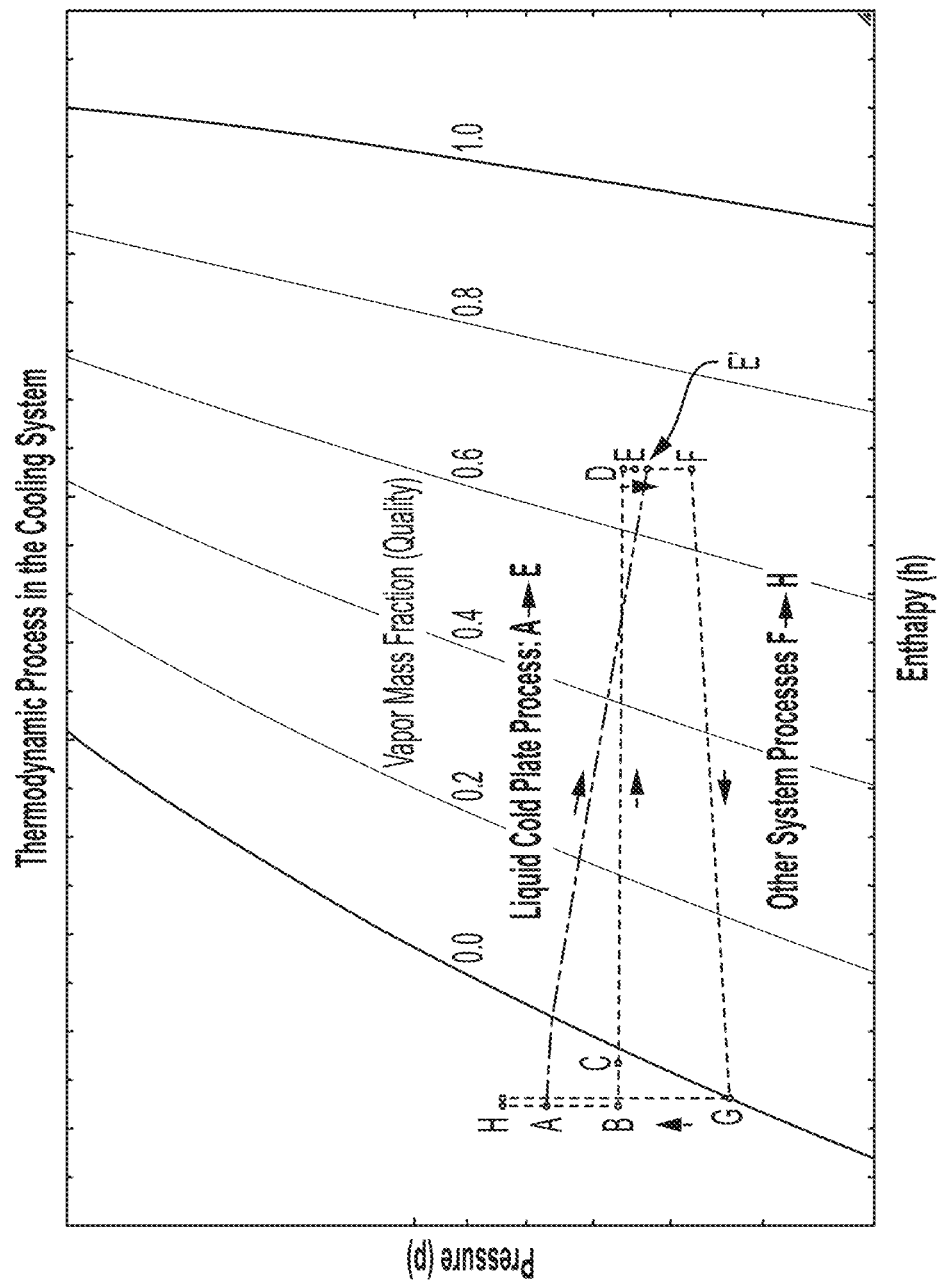
FIG. 6 shows a pressure vs. enthalpy diagram employed by exemplary heat exchangers.

FIG. 6 shows a pressure vs. enthalpy diagram depicting operation of a heat exchanger 1 in an illustrative embodiment, e.g., which may be arranged as in FIGS. 1-5. For the illustrative heat exchanger 1, working fluid enters the heat exchanger 1 in a subcooled state A and exits at a saturated state E. Note that states A through E in FIG. 6 correspond to the working fluid states in flow sections A-E in FIGS. 4 and 5, respectively. As can be seen in FIG. 6, the illustrative heat exchanger 1 has a relatively low pressure drop, particularly from flow sections B through E so the pressure drop is not sensitive to the quality of the exiting fluid. In contrast, prior liquid cooled heat exchangers that employ a two-phase operation follow a path from a subcooled state A to low pressure vapor state E' along the dashed line. There is a large pressure gradient through the heat sink fins of these prior heat exchangers and the overall pressure drop is very sensitive to exit quality. Thus, these systems have a significantly greater variation in pressure drop with fluid exit quality and, as a result, can suffer from working fluid maldistribution discussed above.

Figure 7:
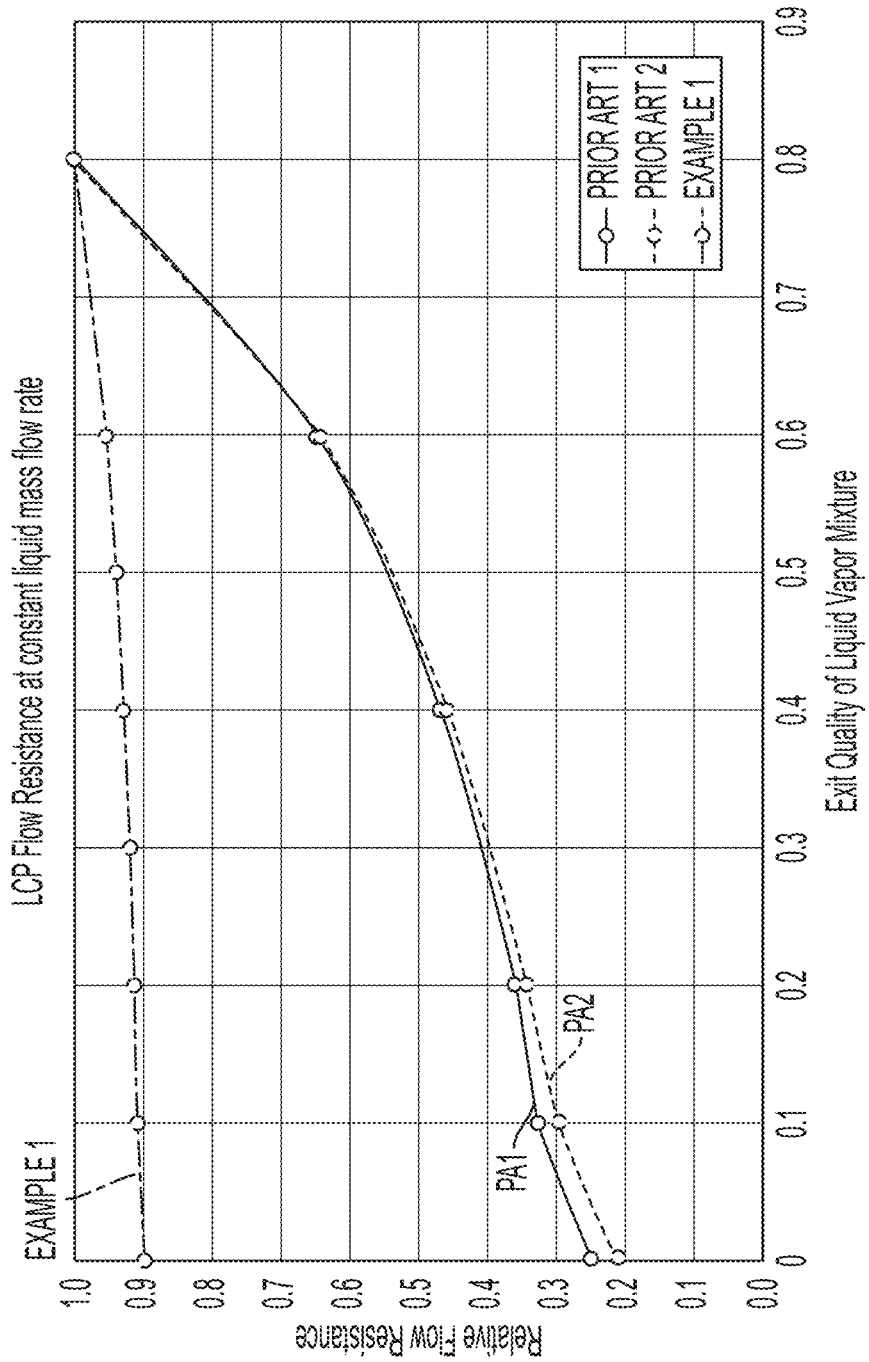
FIG. 7 shows relative flow resistance for an exemplary embodiment compared to two prior art arrangements as a function of quality of the working fluid exiting the device.

FIG. 7 shows relative flow resistance for a heat exchanger 1 in an illustrative embodiment compared to two prior art heat exchanger arrangements. As can be seen in FIG. 7, the resistance to flow for the illustrative heat exchanger 1 is relatively constant, varying between 0.9 and 1 for a wide range of exit quality of liquid-vapor phase working fluid from 0 to 0.8. In contrast, the prior heat exchanger arrangements have a much more variable flow resistance, e.g., from about 0.2 to about 1 for the same range of exit quality of liquid-vapor phase working fluid. This capability of the illustrative heat exchanger 1 can provide significant benefits, particularly when multiple heat exchanger units are connected in parallel to a common working fluid source. Since the illustrative heat exchangers have a relatively constant resistance to flow for a wide range of working fluid exit quality, the pressure drop across the heat exchangers will not vary significantly with changing performance requirements for the heat exchangers. For example, if a first heat exchanger is required to provide significantly greater cooling than a second heat exchanger, the exit quality for the first heat exchanger may be much larger than that for the second heat exchanger. However, since the pressure drop and flow resistance across the two heat exchangers is approximately the same, both the first and second heat exchangers will be provided with a suitable amount of working fluid. In contrast, the prior heat exchangers have a more variable resistance to flow, meaning that if one heat exchanger has a much higher working fluid exit quality, that heat exchanger will receive less working fluid because of its higher resistance to flow. This is counter to its requirements, i.e., the heat exchanger providing more cooling power should be provided with a greater volume of working fluid. The illustrative heat exchangers avoid this problem and enable all heat exchangers to receive suitable volumes and flow rates of working fluid regardless of the cooling power.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

The use of "including," "comprising," "having," "containing," "involving," and/or variations thereof herein, is meant to encompass the items listed thereafter and equivalents thereof as well as additional items.

It should also be understood that, unless clearly indicated to the contrary, in any methods claimed herein that include more than one step or act, the order of the steps or acts of the method is not necessarily limited to the order in which the steps or acts of the method are recited.

While aspects of the invention have been described with reference to various illustrative embodiments, such aspects are not limited to the embodiments described. Thus, it is evident that many alternatives, modifications, and variations of the embodiments described will be apparent to those skilled in the art. Accordingly, embodiments as set forth herein are intended to be illustrative, not limiting. Various changes may be made without departing from the spirit of aspects of the invention.

The invention claimed is:

1. A liquid cooled heat exchanger, comprising:
   a base having a surface configured to receive heat from a heat generating component;
   a first heat sink having a plurality of fins arranged on the base to receive the heat from the base;
   a first heat exchange chamber having an inlet and an outlet and enclosing the first heat sink, the first heat exchange chamber configured to deliver liquid working fluid from the inlet to contact the first heat sink and deliver vapor working fluid from outlet;
   a second heat exchange chamber having an inlet to receive liquid working fluid and an outlet to deliver the liquid working fluid to the inlet of the first heat exchange chamber, the second heat exchange chamber being thermally coupled to the first heat exchange chamber by a thermally conductive plate configured to receive heat from the first heat exchange chamber and transfer the heat to the liquid working fluid in the second heat exchange chamber;
   a cover that together with the plate defines the second heat exchange chamber; and
   a capillary flow channel formed in the cover and fluidly coupled to the inlet of the second heat exchange chamber to provide the liquid working fluid to the second heat exchange chamber.

2. The heat exchanger of claim 1 wherein the plate has first and second sides, the first side of the plate defining in part the first heat exchange chamber and the second side of the plate defining in part the second heat exchange chamber.

3. The heat exchanger of claim 2, wherein the plate is attached to the base such that the plate and base enclose the first heat sink in the first heat exchange chamber.

4. The heat exchanger of claim 3, wherein the first heat sink is located in a space between the base and the plate.

5. The heat exchanger of claim 4, wherein the plate includes an inlet opening to define the inlet to the first heat exchange chamber and an outlet opening to define the outlet from the first heat exchange chamber, the inlet opening being smaller in size than the outlet opening.

6. The heat exchanger of claim 1, wherein the cover defines the inlet to the second heat exchange chamber.

7. The heat exchanger of claim 1, wherein the plate includes heat transfer structure including one or more fins on the second side of the plate that is thermally coupled to the first heat exchange chamber.

8. The heat exchanger of claim 2, wherein working fluid flows in a second direction in the second heat exchange chamber that is parallel to and opposite to flow of working fluid in the first heat exchange chamber.

9. The heat exchanger of claim 1, wherein the second heat exchange chamber includes a portion that increases in cross sectional area in a direction from the inlet to the outlet of the second heat exchange chamber.

10. The heat exchanger of claim 1, wherein the second heat exchange chamber partially overlaps the first heat exchange chamber.

11. The heat exchanger of claim 10, wherein the second heat exchange chamber overlaps an inlet portion of the first heat exchange chamber.

12. The heat exchanger of claim 1, wherein the second heat exchange chamber is configured to receive subcooled liquid working fluid at the inlet of the second heat exchange chamber, heat the subcooled liquid working fluid in the second heat exchange chamber to increase the temperature of the subcooled liquid working fluid, and deliver the heated liquid working fluid to the inlet of the first heat exchange chamber.

13. The heat exchanger of claim 12, wherein the first heat sink includes boiling enhancement features to promote and enhance boiling of the working fluid, and wherein the first heat exchange chamber is configured to heat the liquid working fluid received at the inlet of the first heat exchange chamber to vaporize the liquid working fluid using heat received from the heat generating device and deliver vapor working fluid to the outlet of the first heat exchange chamber.

14. The heat exchanger of claim 1, wherein the base has a first surface and the surface configured to receive heat from the heat generating component is a second surface;
- the plurality of fins are arranged on the first surface of the base to receive the heat from the base; and
- the plate has first and second sides, the first side of the plate positioned over the base such that the first heat sink is located in the first heat exchange chamber between the plate and the base;
- the cover having first and second sides, the second side of the cover positioned over the second side of the plate to define the second heat exchange chamber between the cover and the plate, the cover including the inlet for the liquid working fluid provided to the second heat exchange chamber, and the outlet to receive vapor working fluid from the first heat exchange chamber,
- the base, plate and cover defining a flow path for working fluid that extends from the inlet to the second heat exchange chamber, to the first heat exchange chamber and to the outlet.

15. The heat exchanger of claim 14, wherein the plate is configured to transfer heat from the first heat exchange chamber to liquid working fluid in the second heat exchange chamber.

16. The heat exchanger of claim 15, wherein the plate includes fins on the second side located in the second heat exchange chamber that transfer heat from the first heat exchange chamber to liquid working fluid in the second heat exchange chamber.

17. The heat exchanger of claim 15, wherein the second heat exchange chamber partially overlaps the first heat exchange chamber.

18. The heat exchanger of claim 17, wherein the second heat exchange chamber overlaps an inlet portion of the first heat exchange chamber.

19. The heat exchanger of claim 15, wherein a portion of the second heat exchange chamber increases in cross sectional area in a flow direction from the inlet toward the outlet.

20. The heat exchanger of claim 14, wherein a capillary tube defines the capillary flow channel and is configured to reduce a pressure of the liquid working fluid.

21. The heat exchanger of claim 14, wherein the plate includes an inlet opening to transfer working fluid from the second heat exchange chamber to the first heat exchange chamber and an outlet opening to transfer working fluid from the second heat exchange chamber to the outlet, the inlet opening of the plate being configured as a narrow slot to function as a flow restrictor.

22. The heat exchanger of claim 14, wherein the first heat sink includes boiling enhancement features to promote and enhance boiling of the working fluid.

* * * * *